United States Patent [19]

Kiedrowski

[11] Patent Number: 4,766,398
[45] Date of Patent: Aug. 23, 1988

[54] BROADBAND TEMPERATURE COMPENSATED MICROWAVE CAVITY OSCILLATOR

[75] Inventor: Paul A. Kiedrowski, Hanover Park, Ill.

[73] Assignee: Motorola, Inc., Schaumburg, Ill.

[21] Appl. No.: 44,186

[22] Filed: Apr. 30, 1987

[51] Int. Cl.[4] .......................... H03B 7/14; H03L 1/04
[52] U.S. Cl. .............................. 331/96; 331/107 DP; 331/176; 331/177 V
[58] Field of Search ............... 331/96, 107 R, 107 DP, 331/107 G, 117 D, 176, 177 R, 177 V; 333/229

[56] References Cited

U.S. PATENT DOCUMENTS

| | | | |
|---|---|---|---|
| 3,528,042 | 9/1970 | Weinberger | 333/83 |
| 4,127,834 | 11/1978 | Stringfellow et al. | 331/176 X |
| 4,617,531 | 10/1986 | Bowlds et al. | 331/96 |

OTHER PUBLICATIONS

A Product Specification Sheet for a Gunn Transmitter manufactured by Microwave Associates, Inc.
Specification Sheet for an FM Modulating Cavity Oscillator as manufactured by General Electric.

Primary Examiner—Eugene R. LaRoche
Assistant Examiner—David Mis
Attorney, Agent, or Firm—Jose W. Jimenez; Steven Parmelee

[57] ABSTRACT

This microwave oscillator in one embodiment has two tuning rods (16 and 18) configured to extend within a resonant cavity (12). One of these tuning rods (18) attaches to a shaft (19) that is affixed at one end and that is comprised of a material having a thermal coefficient of expansion that is different from the material comprising the housing (11) that forms the cavity (12). As a result, movement of the tuning rods (16 and 18) will vary as temperature varies, with a resulting stability in the frequency of oscillation.

5 Claims, 3 Drawing Sheets

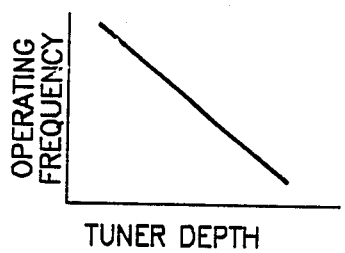
FIG.4B
FIG.5A
UNCOMPENSATED
OSCILLATOR
FREQUENCY DRIFT
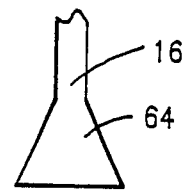
FIG.4A
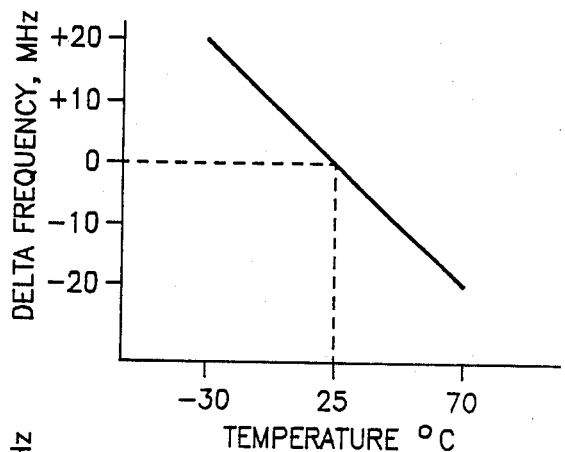
FIG.5B
OSCILLATOR
TUNING CURVE
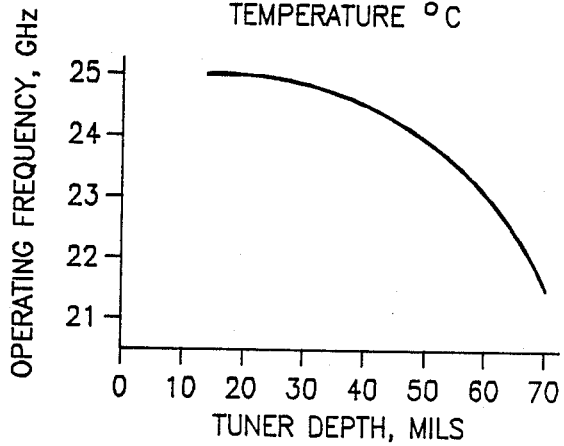
FIG.5C
TUNER SENSITIVITY
(SLOPE OF CURVE
IN FIG.2)
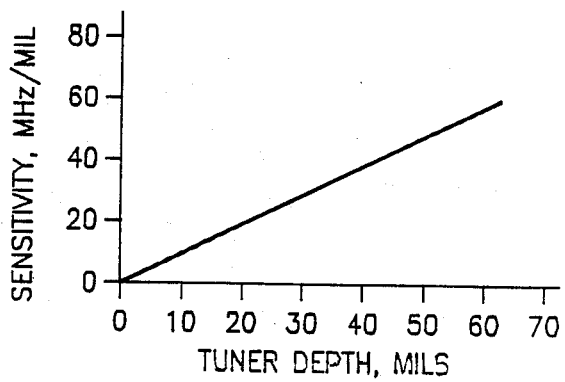

4,766,398

BROADBAND TEMPERATURE COMPENSATED MICROWAVE CAVITY OSCILLATOR

TECHNICAL FIELD

This invention relates generally to the field of microwave RF communications, and particularly to microwave cavity oscillators.

BACKGROUND ART

Microwave based RF communication devices are known. Typically, in communication devices that operate above 2 GHz, transmitter and receiver oscillators are comprised of metal encapsulated cavities that serve to stabilize a free running, active oscillating device such as a Gunn diode. In general, such cavities will support oscillation of the active device at a single frequency, which frequency will be determined by the inside dimensions of the cavity, the dimensions and material of purposely inserted tuning element, and to some extent, the characteristics of the load.

Through the use of tuning elements that can be inserted into the cavity, the frequency can be preselected very accurately as appropriate to accomodate a given system's requirements. Unfortunately, temperature variations will cause this frequency to drift. In particular, the material that defines the cavity will expand or contract slightly with temperature changes. Also, the active device itself will vary its activity somewhat with temperature variations, as will the load characteristics. All of these changes cause a resultant change in the oscillation frequency, and thereby degrade the performance of the device.

To deal with this problem in microwave cavity oscillators, the prior art discloses two alternative solutions. The first, and more popular approach, is to specifically design the oscillator for a given tightly limited frequency range, through choice of materials and mechanical connections. In this way, an oscillator can be designed to remain acceptably stable over a workable temperature range. The great drawback to this approach is the limited tuning range of the resultant oscillator. In addition to increased costs of design and construction to match each desired tuning range to acceptable temperature performance, the manufacturer, distributors, and users of such oscillators must maintain a large inventory of oscillators, since they must be able to accommodate needs over a wide frequency range.

The second prior art approach requires external frequency detection circuity to monitor for drift and to use this information in a feedback loop to control the frequency of oscillation accordingly. This approach represents an expensive alternative, and has found little use to date in many frequency bands above 20 GHz.

A need therefore exists for a broadband temperature compensated microwave cavity oscillator that can be tuned over a wide tuning range, and that can be easily temperature compensated to remain accurate within that tuning range. As an example of the accuracy required, devices intended for operation in the 21.2 GHz to 23.6 GHz radio band can drift no more than plus or minus 0.03% over an ambient operating temperature range of minus 30 degrees C. to positive 50 degrees C.

SUMMARY OF THE INVENTION

These and other needs are substantially met through provision of the broadband temperature compensated microwave cavity oscillator disclosed herein. This oscillator includes generally a housing having a resonant cavity formed therein, an active device located within the resonant cavity for creating the microwave signals, a tuning element for selecting a frequency of oscillation, and a temperature compensation unit internally associated with the resonant cavity for causing the selected frequency of oscillation to automatically remain substantially stable over a standard operating temperature range.

In one embodiment, the temperature compensation unit can include a second tuning element that is insertable within the cavity to thereby vary the resonant characteristics of the cavity and thereby allow the resonant frequency of oscillation to be temperature compensated. This second tuning element can be supported by a support shaft that has a different coefficient of expansion with temperature from that of the housing. Appropriately configured, the second tuning element will tend to be removed from the cavity as temperature increases, and thereby compensate the resonant characteristics of the cavity.

So configured, the temperature compensation unit will not only compensate for variations in the cavity itself, but can also compensate for frequency variations that occur due to temperature as regards the active device and any load associated with the oscillator.

BRIEF DESCRIPTION OF THE DRAWINGS

These and other attributes of the invention will become more clear upon making a thorough review and study of the following description of the Best Mode For Carrying Out the Invention, wherein:

FIG. 4a comprises a detail closeup view of a third embodiment;

FIG. 4b comprises a graph relating to the third embodiment; and

FIGS. 5a–5c are graphs depicting the operation of an uncompensated and compensated oscillator as regards the first and second embodiments.

BEST MODE FOR CARRYING OUT THE INVENTION

Figure 1:
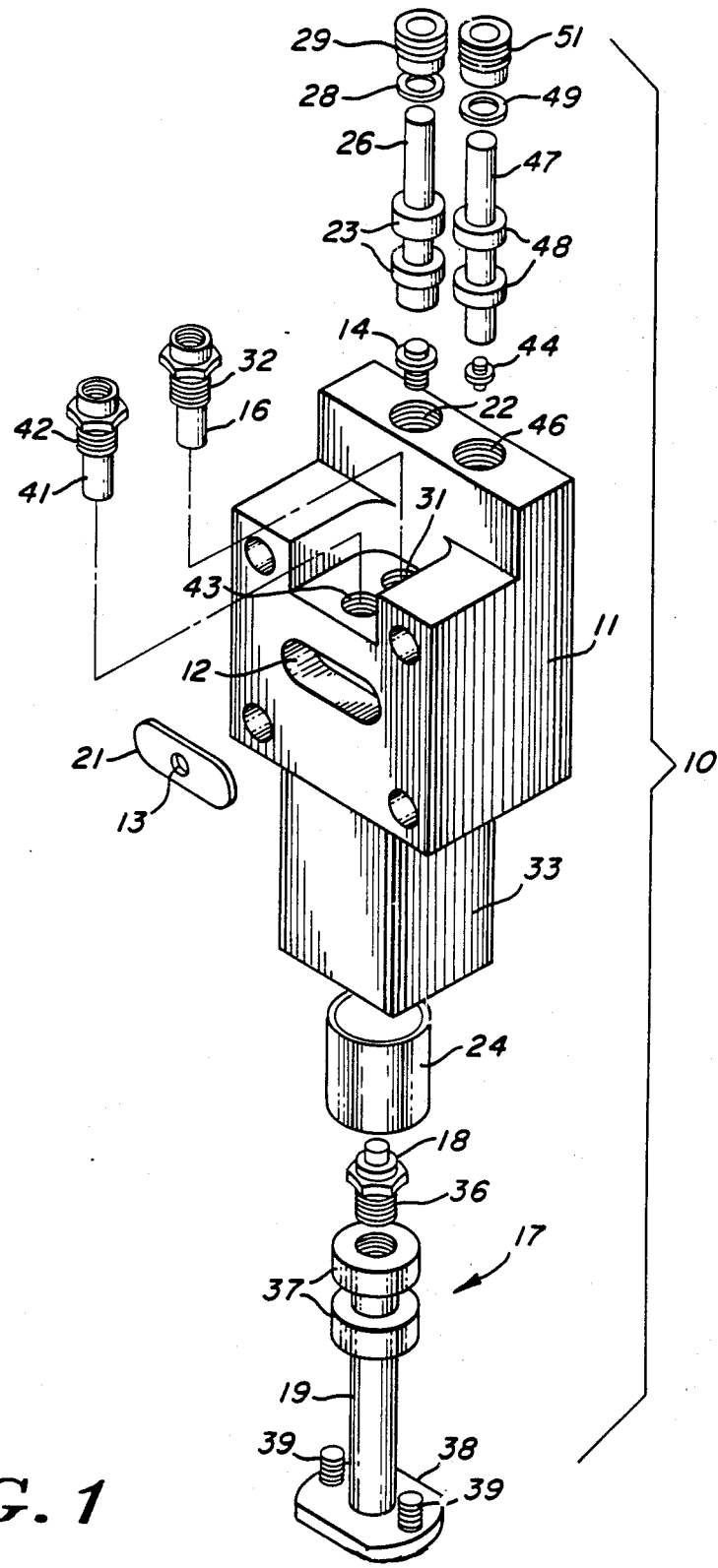
FIG. 1 comprises a perspective exploded view of a first embodiment.
Figure 2:
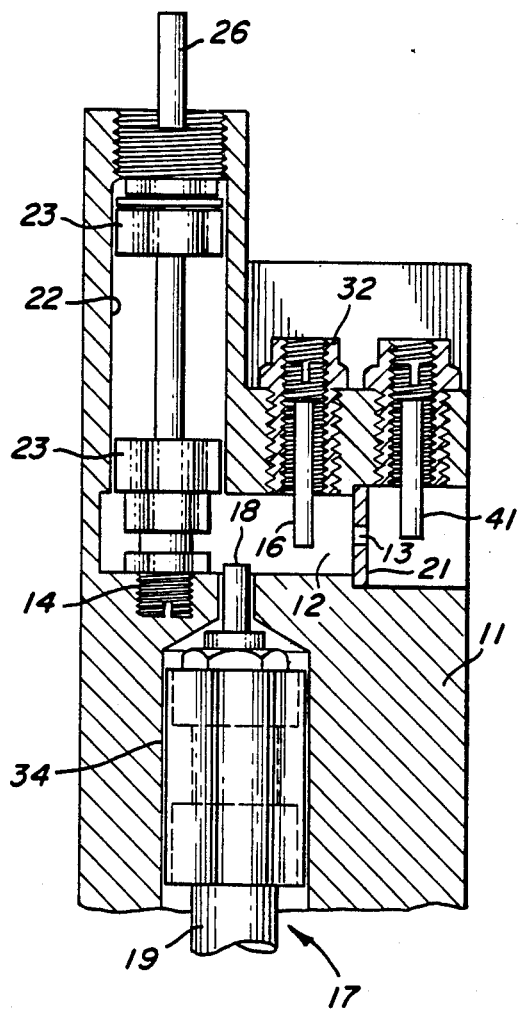
FIG. 2 comprises a detail side elevational section view of this first embodiment.

Referring now to the drawings, and in particular to FIGS. 1 and 2, the invention can be seen as depicted generally by the numeral 10. The invention (10) includes generally a housing (11) having a resonant cavity (12) formed therein, an output port (13) formed to allow access to the resonant cavity (12), an active device (14) for producing the desired oscillations, and a first tuning rod (16) to allow the frequency of oscillation to be selectively tuned. The invention (10) also includes a temperature compensation unit (17) that includes a second tuning rod (18) and a support shaft (19). Each of the above generally referred to components will now be described in more detail in seriatim fashion.

The housing (11) can be comprised of a substantially rectangular shaped block formed of an appropriate metal, such as copper. The resonant cavity (12) can be formed therein in accordance with well understood prior art technique, and the output port (13) formed through one side of the housing (11) to allow controlled escape of the desired microwave oscillations. As well understood in the art, an output iris (21) can be soldered to the housing (11) to control escape of the microwave oscillations through the output port (13).

A partially threaded opening (22) can be provided through the housing (11) to allow implacement of the active device (14). The active device itself can be a Gunn diode as well understood in the art. Gunn bias chokes (23) are positioned with respect to the active device (14), with at least a portion of the choke having insulating medium, such as Mylar tape (not shown), mounted thereabout, all in accordance with well understood prior art technique. An associated shaft (26) passes through an appropriate insulating washer (28) and threaded bushing (29), the latter being threadably insertable into the opening (22) provided therefore in the housing (11). So configured, the active device (14) can be properly located within the cavity (12) as depicted.

Another threaded hole (31) can be provided through the housing (11) to accommodate a first tuning rod comprised of an appropriate dielectric material. This first tuning rod (16) passes through a bushing (32), which bushing (32) can be threadably inserted into the hole (31) provided therefore. So configured, the first tuning rod (16) can be selectively inserted into or withdrawn from the cavity (12), such that the first tuning rod (16) can affect the frequency of oscillation.

The temperature compensation unit (17) includes a second tuning rod (18), a support shaft (19), and a support chamber (33). The support chamber (33) comprises an extension of the housing (11) and includes a hole (34) formed therethrough, which hole (34) connects to the resonant cavity (12) of the housing (11). The second tuning rod (18) and an associated bushing (36) connect atop a support shaft (19) having appropriate chokes (37) configured therewith. The support shaft (19) affixes at one end to a plate (38) that can be attached to one end of the support chamber (33) through use of screws (39) or other appropriate affixing members. Importantly, the support shaft (19) should be comprised of a material having a different coefficient of expansion with temperature than that of the housing (11). For instance, Invar may be used. The significance of this will be made more clear below.

Other additional elements may be appropriate to add, depending upon the application. For instance, a dielectric power adjuster (41) and an associated bushing (42) may be provided through a hole (43) provided therefore to allow the power output of the oscillator to be controlled. As depicted in FIG. 2, this power adjustment rod (41) should be positioned exterior to the iris (21). Also, in a frequency modulation application, a modulation varactor (44) may be mounted within the cavity (12) through use of an appropriate hole (46) provided through the housing (11) and an appropriate shaft (47), chokes (48), insulating washer (49) and bushing (51) as configured. In accordance with well understood prior art technique, the varactor (44) can be appropriately controlled to frequency modulate the output of the oscillator.

Operation of the invention (10) can now be described.

With reference to FIG. 5a, the frequency drift of a high Q (low loss) cavity oscillator closely approximates a linear function with respect to temperature. As temperature increases, the metal cavity expands, and the resonant frequency of the cavity decreases as depicted.

The dielectric material (such as ceramic or glass) comprising the tuning rods of the invention (10) also can affect the frequency of oscillation. This relationship, however, does not constitute a linear one. As depicted in FIG. 5b, the frequency of oscillation will decrease in a nonlinear way as the insertion depth of the tuning rod into the cavity increases. Although nonlinear, this relationship is predictable, and hence allows the temperature compensation of the invention (10) to be realized.

The support shaft (19) of the temperature compensation unit (17) has a lower temperature coefficient of expansion (K) than the surrounding material. The shaft connects at one end distal from the cavity (12), such that as temperature increases, the shaft (19) will expand less than the support chamber (33) and hence function to extract the second tuning rod (18) from the cavity (12).

By constructing the second tuning rod (18) of sapphire (K=5 ppm/deg C.), the support shaft (19) of Invar (a nickel-iron alloy, K=2 ppm/deg C.), and the housing (11) of copper (K=17 ppm/deg C.), a controlled temperature compensated configuration will result. The longer the length of the support shaft (19), the greater the resulting movement. With a shaft of 3.302 cm (1.3 inches) in length, approximately 0.00508 cm (0.002 inches) of tuner movement from negative 30 degrees C. to positive 70 degrees C. can be obtained.

Since the slope of the tuning curve (FIG. 5b) increases at an almost constant rate as the tuner is inserted, a greater degree of frequency change will result when the tuner is moved slightly when deep within the cavity (12) than when it has barely been inserted. This sensitivity, or slope of the curve as depicted in FIG. 5b, can be seen in FIG. 5c, and constitutes a linear function. Therefore, the amount of compensation can clearly be varied by changing the depth of the tuner into the cavity. Since this can also change the operating frequency, the first tuning rod (16) must be kept relatively short so as not to affect the temperature compensation (i.e., its relative depth within the cavity (12) remains substantially the same over the expected temperature range).

To appropriately tune and compensate the oscillator, the second tuning rod can first be adjusted for compensation, and the oscillator then tuned back to the desired frequency with the first tuning rod (16).

Through provision of the above described invention (10) this microwave cavity oscillator can be tuned and compensated over the full bandwidth of the oscillator through relatively simple appropriate placement of the first and second tuning rods vis-a-vis the cavity (12). No parts need be replaced to make the oscillator compatible at a new frequency, and no expensive external feedback mechanisms need be provided. As a result, a single part can be utilized to replace what previously required an inventory of up to 48 different parts, thereby contributing significant cost savings to all relevant parties.

Figure 3:
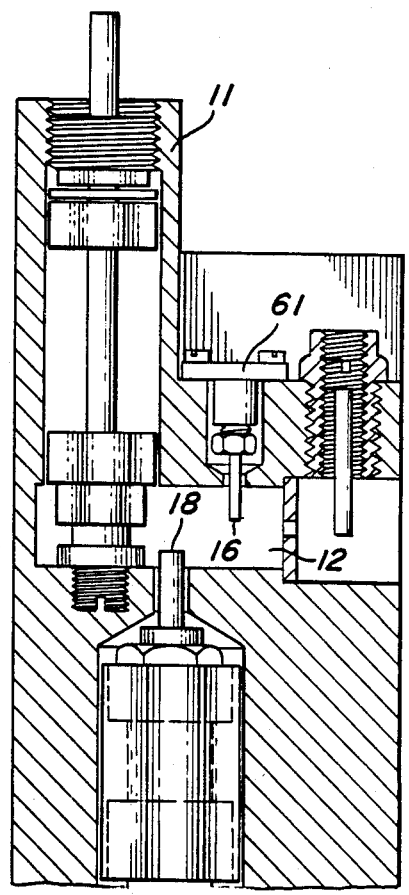
FIG. 3 comprises a detail side elevational section view of a second embodiment.

Referring now to FIG. 3, an alternative embodiment can be seen wherein the first tuning rod (16) also connects to a support shaft (61) that is affixed at one end to the housing (11). By this configuration, both the first tuning rod (16) and the second tuning rod (18) will move relative to the cavity (12) with temperature variations. In this way a greater compensation range can be made available.

With reference to FIG. 4a, yet another embodiment can be seen to comprise a device having only a single tuning rod (16), wherein the tuning rod (16) connects to a support shaft (61) as depicted in FIG. 3 and has an enlarged end (64) to provide a linear as versus nonlinear relationship as depicted in FIG. 4b. Although this particular embodiment will not provide the same high precision of temperature stability as the embodiments depicted above, substantial drift reduction does result and may be appropriate for use in certain applications.

Those skilled in the art will recognize that various modifications and changes could be made with respect to the invention without departing from the spirit and scope of the claims. It should therefore be understood that the claims are not to be considered as limited to the precise embodiments described in the absence of explicit limitations directed thereto.

I claim:

1. A broadband compensated microwave cavity oscillator having:
   a housing, made substantially of a single material, having a resonant cavity formed therein and having an output port formed to allow microwave signals formed within said resonant cavity to escape from within said resonant cavity;
   active device means within said resonant cavity for forming microwave signals through oscillation within said resonant cavity; and
   tuning means for selecting a frequency of oscillation; and
   means for compensating for frequency variations in said oscillator due to variations in said cavity due to temperature and cavity structure material, variations in said active device means due to temperature, and variations due to electrical loads associated with said oscillator, said frequency compensating means being internally associated with said cavity.

2. The broadband microwave cavity oscillator according to claim 1 wherein said frequency compensating means is comprised of:
   second tuning means, disposed within said housing, that includes a small dielectric tuning rod that exhibits a negligible coefficient of expansion but is sufficiently large to be insertable in said cavity and be supported by support means, said support means having a different coefficient of expansion with temperature than said housing, such that said second tuning means will tend to be removed from said cavity as temperature increases and will provide a lower tuning rate over a wider bandwidth to allow for adjustments in variations in said active device means and in oscillator loading.

3. The broadband microwave cavity oscillator according to claim 1 wherein said tuning means is comprised of a dielectric tuning rod that is insertable in said cavity for varying the frequency of oscillation.

4. The broadband microwave cavity oscillator according to claim 3 wherein said tuning means is comprised of a first dielectric tuning rod, connected to a support shaft, that is insertable in said cavity, said first and second tuning rods moving relative to temperature variations to broaden the compensation range.

5. The broadband microwave cavity oscillator according to claim 4 further comprising an output iris, and a dielectric power adjuster disposed in said housing exterior to said output iris, said power adjuster controlling the power output of said oscillator across a particular frequency band.

* * * * *